United States Patent [19]

Malka et al.

[11] Patent Number: 4,680,726
[45] Date of Patent: Jul. 14, 1987

[54] FUNCTION GENERATOR

[75] Inventors: Jacob H. Malka, Fair Lawn; Marc Osetec, Wood-Ridge, both of N.J.

[73] Assignee: Allied Corporation, Morris Township, Morris County, N.J.

[21] Appl. No.: 662,320

[22] Filed: Oct. 18, 1984

[51] Int. Cl.$^4$ ............................ G06F 1/02; H03C 1/00
[52] U.S. Cl. ................................. 364/721; 364/718; 332/31 R
[58] Field of Search ............................. 364/718–722, 364/851; 332/31 R, 17, 22, 44; 307/264, 271, 498, 14, 156

[56] References Cited

U.S. PATENT DOCUMENTS

| | | | |
|---|---|---|---|
| 3,484,723 | 12/1969 | Rypkema | 332/44 |
| 3,668,562 | 6/1972 | Fritkin | 332/22 |
| 3,778,718 | 12/1973 | Bass et al. | 332/17 |
| 4,360,788 | 11/1982 | Erps et al. | 307/217 |

Primary Examiner—Archie E. Williams, Jr.
Assistant Examiner—Tan V. Mai
Attorney, Agent, or Firm—Howard G. Massung; Stanley N. Protigal

[57] ABSTRACT

A function generator having the capability of providing a repetitive output signal with a high degree of versatility in waveform, frequency and amplitude, and with a high degree of resolution. Low frequency (76) and high frequency (86) signal are provided separately, or are combined (108) to provide an amplitude modulated output signal in either a full or suppressed carrier mode (110). Low frequency waveforms are stored (20) and high frequency and user defined waveforms are downloaded from a central processing unit (2). An output attenuator (72, 78, 82, 88) controls the output signal amplitude with a high degree of resolution. An output selective built-in test capability (116) is provided.

17 Claims, 2 Drawing Figures

FUNCTION GENERATOR

BACKGROUND OF THE INVENTION

Prior to the present invention, function, i.e., waveform, generators have been rack mounted or bench type units, programmable via an appropriate input bus or manually via front panel controls, and have generally been bulky and complex. Moreover, their function generating versatility has been limited. The present invention overcomes these disadvantages in that it is a relatively simple circuit arrangement controlled by a central processing unit via an input bus. The circuitry and techniques inherent in the invention provide wide versatility in the choice of waveform, frequency and amplitude. High resolution of output waveform amplitude is achieved via a novel arrangement of multiplying digital to analog converters and operational amplifiers.

SUMMARY OF THE INVENTION

This invention contemplates a function generator controlled by a central processing unit (CPU) for providing independent low frequency and high frequency output signals, or a modulated output signal which is a combination of the two. The low frequency signal is provided by using an intelligent waveform synthesizer which provides a desired waveform. The high frequency signal is provided by loading a recirculating random access memory (RAM) via the CPU to provide a desired output of any standard or non-standard repetitive waveform. The frequency of the high frequency waveform is controlled by a phase-locked loop. The low and high frequency signals are applied to identical output stages in an arrangement which provides output signals having a high resolution. The low frequency (modulating) signal and the high frequency (carrier) signal are combined to provide an amplitude modulated signal.

DETAILED DESCRIPTION OF THE DRAWING

Figure 1:
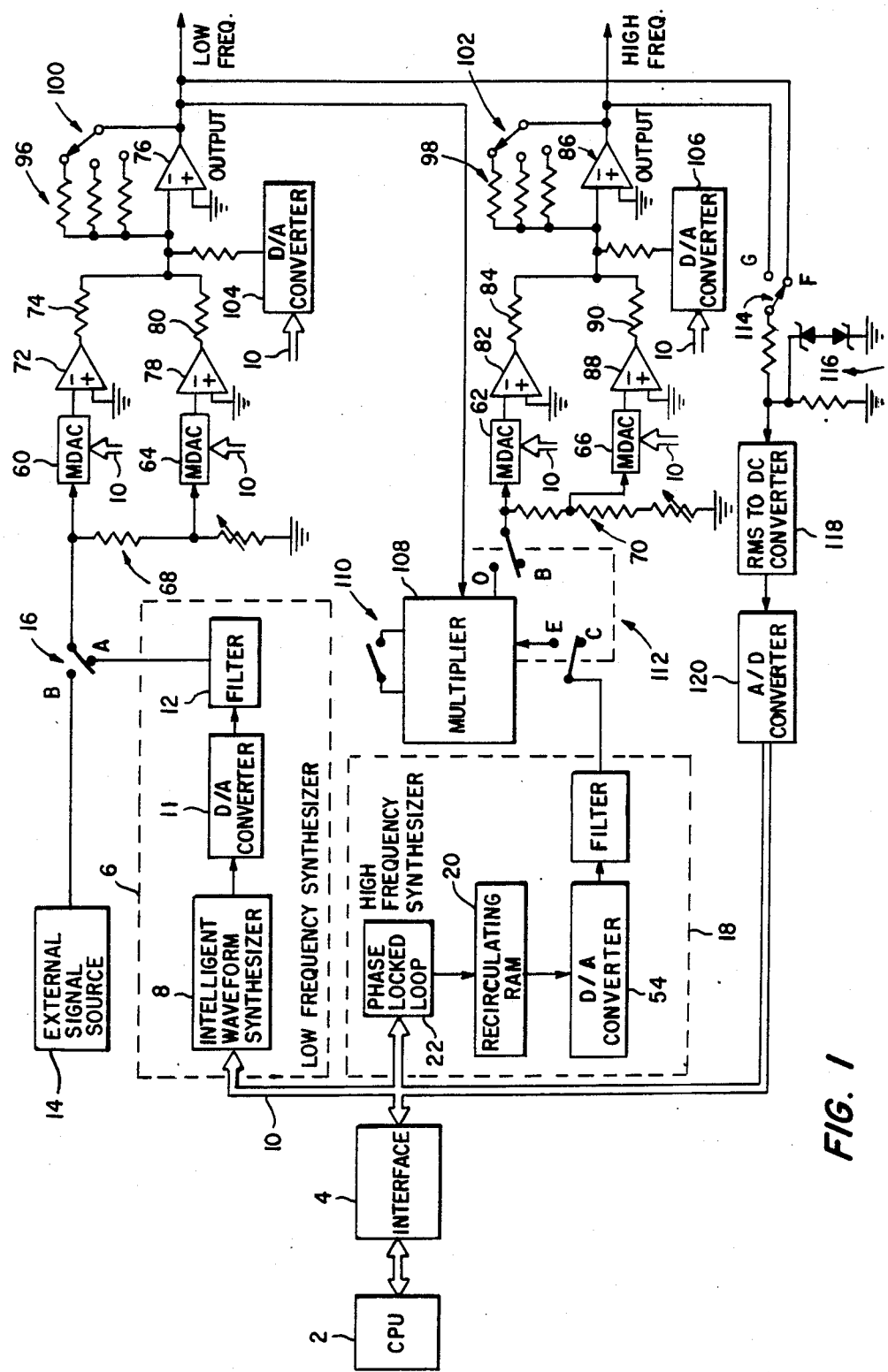
FIG. 1 is a block diagram-electrical schematic of a function generator according to the invention.

With reference to FIG. 1, the function generator of the invention is controlled by a central processing unit 2 via a standard interface 4 for providing a low frequency signal, a high frequency signal or a single modulated signal which is a combination of the low and high frequency signals.

The low frequency signal is provided by a low frequency synthesizer 6 including an intelligent waveform synthesizer 8 driven by interface 4 through a data bus 10. In a structural arrangement to be described, low frequency synthesizer 6 has the capability of generating sine waves, square waves, triangular waves, saw tooth waves and user defined functions, as the case may be.

Intelligent waveform synthesizer 6 provides a digital output which is applied to a digital to analog converter 11. Converter 11 provides an analog output which is filtered (smoothed) by a low pass filter 12. Alternatively, a signal from an external signal source 14 may be used in place of the signal from filter 12, and which external signal is switched into the circuit via a switch 16 having its arm in a position B rather than in a position A as shown.

The high frequency signal is provided by a high frequency synthesizer 18 including a recirculating random access memory (RAM) 20 which is loaded with digital patterns via bus 10 and a phase-locked loop 22. High frequency synthesizer 18 has the capability of generating any non-standard or standard repetitive waveform such as sine wave, square wave, or triangular wave, as the case may be. The frequency at which the waveform is generated is controlled by phase-locked loop 22.

Figure 2:
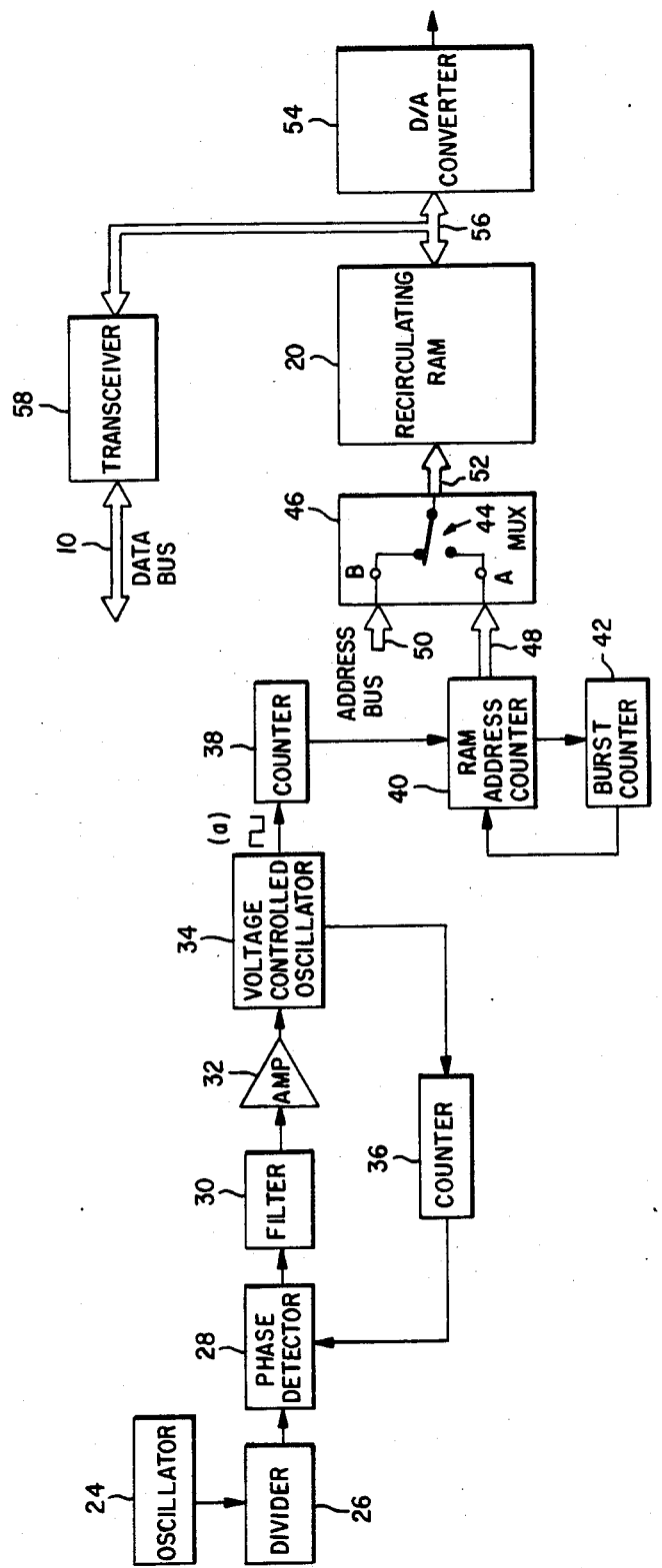
FIG. 2 is a block diagram-electrical schematic more particularly showing the high frequency synthesizer shown in FIG. 1.

With particular reference to FIG. 2 wherein high frequency synthesizer 18 is shown in detail, an external oscillator 24 provides an output which is divided down to a desired frequency by a divider 26.

The output of divider 26 is applied to a phase detector 28 and therefrom to a low pass (smoothing) filter 30. The output of low pass filter 30 is amplified by an amplifier 32 and the amplified output is applied to a voltage controlled oscillator 34. Voltage controlled oscillator 34 drives a counter 36 which controls phase detector 28 in a feedback configuration.

The output of voltage controlled oscillator 34, which is a pulse output designated as (a) in FIG. 2, is divided by a counter 38. The counter 38 output drives a recirculating random access memory (RAM) address counter 40. The output of counter 40 thus represents the total number of random access memory (RAM) locations used to store a particular waveshape. RAM address counter 40 drives a burst counter 42, the output of which is fed back to the RAM address counter. Thus, the option is available of loading a specific starting address into the RAM address counter or bursting a limited number of cycles thereto, as the case may be. The output of recirculating RAM address counter 40 is also applied to a terminal A of a selectively operating switch 44 in multiplexer (MUX) 46 via a bus 48. A specific address is loaded into MUX 46 via a CPU address bus 50 connected to a terminal B of switch 44 in MUX 46 as shown in FIG. 2.

The output of MUX 46 drives recirculating RAM 20 (also shown in FIG. 1) through a bus 52 and recirculating RAM 20 drives digital to analog converter 54 (also shown in FIG. 1) via a bus 56.

With continued reference to FIG. 2, the output of recirculating RAM 20 is applied via bus 56 to a transceiver 58. The output of transceiver 58 is applied to data bus 10. In the arrangement shown, transceiver 58 provides a desired isolation when CPU 2 (FIG. 1) is not being used or when recirculating RAM 20 is not being addressed.

With reference again to FIG. 1, the signals provided by low frequency synthesizer 6 (or external signal source 14) and high frequency synthesizer 18 are applied to identical output stages including multiplying digital to analog converters (MDAC's) 60 and 62, both of which may have, for purposes of illustration, an eight bit resolution, and to MDAC's 64 and 66, both of which may have, for purposes of illustration, a twelve bit resolution.

The low frequency signal from the low frequency synthesizer 6 is applied to MDAC's 60 and 64 through a resistor-divider circuit 68, and the high frequency signal from high frequency synthesizer 8 is applied to MDAC's 62 and 66 through a resistor-divider circuit 70. MDAC's 60, 62, 64 and 66 are controlled via bus 10. The arrangement is such that the pair of MDAC's 60 and 64, and the pair of MDAC's 62 and 66 are arranged to give a high resolution, such as, for purposes of illustration, a twenty bit resolution (the sum of the eight and twelve bit resolutions) to both the low and high frequency signals.

The output of MDAC 60 is applied through an operational amplifier 72 and a resistor 74 to an output operational amplifier 76. The output of MDAC 64 is applied through an operational amplifier 78 and a resistor 80 to amplifier 76. Amplifier 76 provides a low frequency RMS output signal having the aforenoted high resolution.

The output of MDAC 62 is applied through an operational amplifier 82 and a resistor 84 to an output operational amplifier 86 and the output of MDAC 66 is applied through an operational amplifier 88 and a resistor 90 to amplifier 86. Amplifier 86 provides a high frequency RMS output having the aforenoted high resolution.

Thus, amplifier 76 combines the outputs of amplifiers 72 and 78 and amplifier 86 combines the outputs of amplifiers 82 and 88. The resolution of resistors 80 and 90, leading from amplifiers 78 and 88 rspectively, is a large multiple of the resistance of resistors 74 and 84 leading from amplifiers 72 and 82, respectively, so that each voltage increment from MDAC's 60 and 62 is divided into increments by MDAC's 64 and 66, thereby providing the aforenoted high output voltage resolution.

A feedback resistor network 96 is connected to output amplifier 76 and a feedback resistor network 98 is connected to output amplifier 86. The gain of output amplifiers 76 and 86 is controllable by changing the value of the feedback resistance via switches 100 and 102, respectively, thus permitting several ranges of available output voltages as will now be understood.

A digital to analog converter 104 is connected between the outputs of amplifiers 72 and 78 and resistor network 96 and a digital to analog converter 106 is connected between the outputs of amplifiers 82 and 88 and resistor network 98. Digital to analog converters 104 and 106, driven by bus 10, provide a d.c. offset voltage which is also summed by the respective output amplifiers 76 and 86. It will be understood that as the output signal ranges change by changing the feedback resistance via resistance networks 96 and 98, the d.c. offset voltage range is also changed as is desirable.

In the arrangement shown and described, the low frequency, high resolution signal provided by output amplifier 76 is a modulating signal and the high frequency signal provided by high frequency synthesizer 18 is a carrier signal. These signals can be combined to provide an amplitude modulated signal by multiplying the product of the two signals in a multiplier 108.

An analog switch 110 is connected to multiplier 108 for providing an amplitude modulated signal with full carrier or suppressed carrier, as the case may be. Thus, the arrangement is such that when switch 110 is in the open position as shown, a carrier component is added to provide a full carrier signal and when the switch is closed a suppressed carrier signal is provided.

A switching means 112 is arranged with multiplier 108 and with high frequency synthesizer 18. When the switch arms are connected to switch terminals B and C as shown in the figure, the high frequency signal from synthesizer 18 is applied directly to the high frequency output (MDAC) stage. When the switch arms are activated to positions D and E, the high frequency signal is combined in the modulated mode with the low frequency signal from output amplifier 76. The modulated output from modulator 108 is applied to the high frequency output stage.

The function generator of the invention features a built-in test capability which permits selection of either the low frequency or high frequency RMS outputs via a switch 114. Thus, when switch 114 is in position F as shown, the low frequency output is selected and when the switch is in position G the high frequency output is selected, as will now be understood.

Switch 114 is connected through a resistor-Zener diode (limiting) network 116 to an RMS to d.c. converter 118. The analog d.c. output from converter 118 is applied to an analog to digital converter 120 and therefrom to data bus 10.

There has thus been described a function generator which generates independent low frequency and high frequency signals, or an amplitude modulated signal which is a combination of the two. The low frequency signal is generated by using an intelligent waveform synthesizer and the high frequency signal is generated by loading a recirculating RAM via a central processing unit to provide a desired output of any standard or non-standard repetitive waveform. The frequency of the waveform is controlled by a phase-locked loop. The low and high frequency signals are applied to identical output stages, with the arrangement being such that the low and high frequency output signals have a high resolution. The high resolution, low frequency (modulating) signal and the high frequency (carrier) signal are combined to provide the amplitude modulated signal.

It will be understood that the elements of the invention herein described and shown in the drawing are commercially marketed elements readily available as circuit cards or chips. The novelty of the invention therefore resides in the combination of these elements and not in the elements themselves.

With the aforegoing description of the invention in mind, reference is had to the appended claims for a definition of the scope of the invention.

What is claimed is:

1. A function generator, characterized by:
   means for providing a low frequency output function signal;
   means for providing a high frequency output function signal;
   means responsive to the low frequency output function signal for providing a high resolution, low frequency output function signal;
   means responsive to the high frequency output function signal for providing a high resolution, high frequency output function signal;
   means for combining the high frequency output function signal and the high resolution, low frequency output function signal for providing an amplitude modulated signal; and
   switching means connected to the high frequency output function signal means and the combining means, and selectively operating for connecting the high frequency output function signal to the combining means, and for disconnecting said signal from said combining means.

2. A function generator as described by claim 1, characterized by:
   other switching means connected to the combining means and the high resolution, high frequency output function signal means, and selectively operating to connect the signal from the combining means to the high resolution, high frequency output function signal means, and to disconnect said signal from said means.

3. A function generator as described by claim 1, wherein the means for providing a low frequency output function signal is characterized by:
   input processing means;
   interface means connected to the input processing means; and
   intelligent function signal synthesizer means connected to the interface means and driven therethrough by the input processing means to provide the low frequency output function signal.

4. A function generator, characterized by:
   means for providing a low frequency output function signal;
   means for providing a high frequency output function signal including input processing means, interface means connected to the input processing means and memory means connected to the interface means to provide the high frequency output function signal;
   means responsive to the low frequency output function signal for providing a high resolution, low frequency output function signal;
   means responsive to the high frequency output function signal for providing a high resolution, high frequency output function signal; and
   means for combining the high frequency output function signal and the high resolution, low frequency output function signal for providing an amplitude modulated signal.

5. A function generator as described by claim 4, wherein the means for providing the high frequency output function signal is further characterized by:
   means for providing a signal corresponding to a predetermined number of memory means locations for storing a particular output function.

6. A function generator as described by claim 5, further characterized by:
   means responsive to the signal corresponding to the predetermined number of memory means locations for storing a particular output function for providing an address for the memory means.

7. A function generator as described by claim 3, wherein the means responsive to the low frequency output function signal for providing a high resolution, low frequency output function signal is characterized by:
   first means controlled by the interface means for applying a first predetermined resolution to the low frequency output function signal, and for providing a signal commensurate therewith;
   second means controlled by the interface means for applying a second predetermined resolution to the low frequency output function signal, and for providing a signal commensurate therewith; and
   means for combining the signals from the first and second means for providing the high resolution, low frequency output function signal having a resolution which is a function of the first and second predetermined resolutions.

8. A function generator as described by claim 4, wherein the means responsive to the high frequency output function signal for providing a high resolution, high frequency output function signal is characterized by:
   first means controlled by the interface means for applying a first predetermined resolution to the high frequency output function signal and for providing a signal commensurate therewith;
   second means controlled by the interface means for applying a second predetermined resolution to the high frequency output function signal and for providing a signal commensurate therewith; and
   means for combining the signals from the first and second means and for providing the high resolution, high frequency output function signal having a resolution which is a function of the first and second predetermined resolutions.

9. A function generator as described by claim 7, further characterized by:
   means for adjusting the gain of the means for combining the signals from the first and second means, whereby the range of the high resolution, low frequency output function signal is changed.

10. A function generator as described by claim 8, further characterized by:
    means for adjusting the gain of the means for combining the signals from the first and second means, whereby the range of the high resolution, high frequency output function signal is changed.

11. A function generator, characterized by:
    means for providing a low frequency output function signal;
    means for providing a high frequency output function signal;
    means responsive to the low frequency output function signal for providing a high resolution, low frequency output function signal;
    means responsive to the high frequency output function signal for providing a high resolution, high frequency output function signal;
    means for combining the high frequency output function signal and the high resolution, low frequency output function signal for providing an amplitude modulated signal;
    input processing means;
    interface means connected to the input processing means; and
    the means for providing a low frequency output function signal and the means for providing a high frequency output function signal connected to the interface means and driven thereby.

12. A function generator as described by claim 1, further characterized by:
    the low frequency, high resolution output function signal being a modulating signal;
    the high frequency output function signal being a carrier signal; and
    means arranged with the combining means and selectively operating so that said combining means provides the amplitude modulated signal in one mode of full carrier and suppressed carrier modes.

13. A function generator as described by claim 7, further characterized by:
    the resolution of the high resolution, low frequency output function signal being the sum of the first and second predetermined resolutions.

14. A function generator as described by claim 8, further characterized by:
    the resolution of the high resolution, high frequency output function signal being the sum of the first and second predetermined signals.

15. A function generator characterized by:
    means for providing a low frequency output function signal;

means for providing a high frequency output function signal;

means connected to the low frequency output function signal means and responsive to the signal therefrom for providing a low frequency output function signal having a high resolution;

combining means connected to the high frequency output function signal means and the high resolution low frequency output function signal means for combining the signals therefrom to provide an amplitude modulated signal;

the low frequency high resolution output function signal being a modulating signal;

the high frequency output function signal being a carrier signal; and switching means connected to the high frequency output function signal means and selectively operating so that said combining means provides the amplitude modulated signal in one mode of full carrier and suppressed carrier modes.

16. A function generator as described by claim 4, further characterized by:

phase controlling means connected between the interface means and the memory means for controlling the frequency of the high frequency output function signal.

17. A function generator as described by claim 11, further characterized by:

switching means connected to the means for providing the high resolution, low frequency output function signal, the means for providing the high resolution, high frequency output function signal, and the interface means; and the switching means being selectively operating for applying one of the high resolution, low frequency output function and the high resolution, high frequency output function signals to the interface means.

* * * * *